United States Patent [19]

Minami et al.

[11] Patent Number: 4,669,071
[45] Date of Patent: May 26, 1987

[54] PHOTO SENSOR DEVICE AND OPTICAL PICKUP DEVICE

[75] Inventors: Toshihiko Minami; Isao Umezawa, both of Kanagawa; Kenji Shintani, Tokyo, all of Japan

[73] Assignee: Sony Corporation, Tokyo, Japan

[21] Appl. No.: 747,559

[22] Filed: Jun. 21, 1985

[30] Foreign Application Priority Data

Jun. 30, 1984 [JP] Japan ............................... 59-99285[U]

[51] Int. Cl.⁴ .............................................. G11B 7/00
[52] U.S. Cl. ........................................ 369/44; 369/45;
369/46; 369/120
[58] Field of Search ................... 358/342; 369/43–47,
369/120; 250/201 DF

[56] References Cited
U.S. PATENT DOCUMENTS 4,542,492  9/1985  LeTerme et al. ..................... 369/46

Primary Examiner—Robert L. Richardson
Attorney, Agent, or Firm—Lewis H. Eslinger; Alvin Sinderbrand

[57] ABSTRACT

A photosensor device and an optical pickup device incorporating the photosensor device are advantageously used in an optical compact disc player of the type where the optical pickup device is driven along a path at an acute tilt angle relative to the sides of a rectangular casing. The photosensor has a plurality of photosensitive elements aligned in a first direction and a plurality of terminal leads extending parallel to each other and perpendicular to a second direction so that the photosensor may be mounted on a circuit board in a conventional configuration to save space. Within the optical pickup device, the photosensitive elements are aligned at a mounting angle which is a function of the tilt angle so that the three optical beams are received thereon in the proper orientation.

21 Claims, 9 Drawing Figures

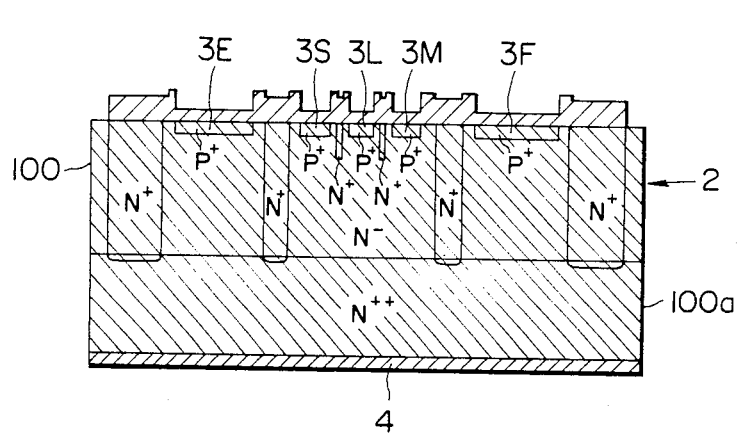
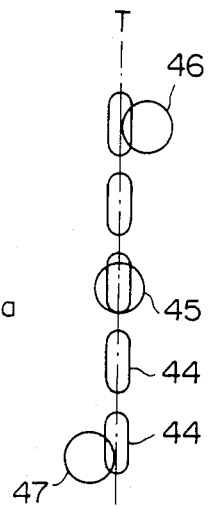
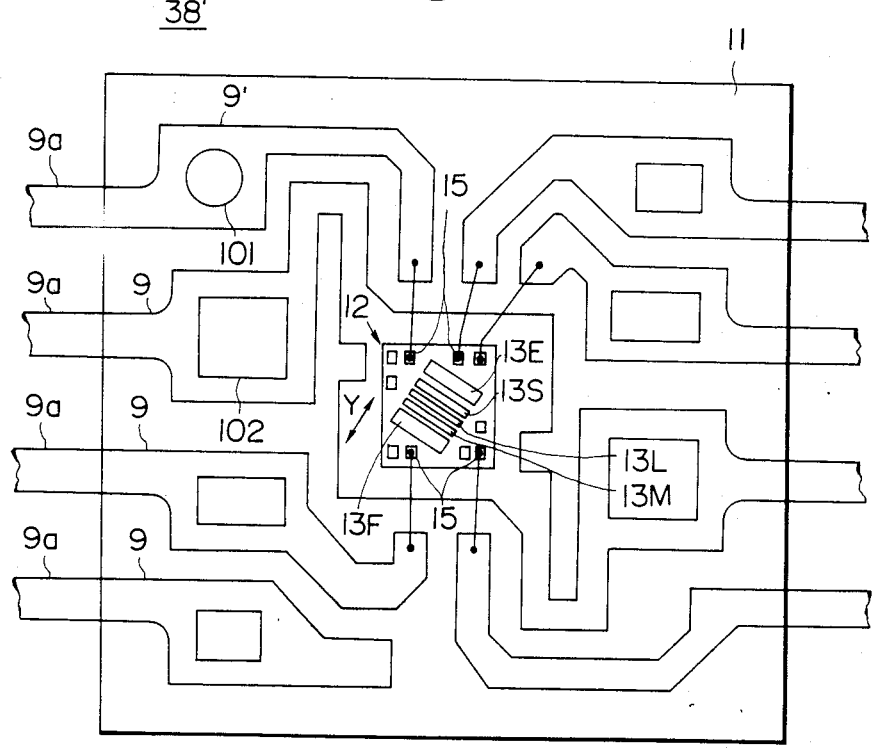

PHOTO SENSOR DEVICE AND OPTICAL PICKUP DEVICE

RELATED APPLICATION

The present application is related to U.S. patent application Ser. No. 06/603,370, filed Apr. 24, 1984, by persons having an obligation of assignment to the assignee of the present application and assigned in common herewith.

FIELD OF THE INVENTION

This invention relates to a photosensor device and an optical pickup incorporating the photosensor device, particularly advantageous employment in an optical compact disc player.

BACKGROUND OF THE INVENTION

In conventional compact disc players, the surface of the disc bears a number of substantially circular record tracks, each composed of a row of pits or bumps indicative of a recorded information signal. The signal recorded in a track is reproduced by irradiating the record track with a coherent light beam, advantageously a laser beam, which is then reflected from the disc surface in a modulated condition indicative of the recorded signal. The modulated reflected beam is directed to fall on a photosensor device, which generates electrical signals in response to the amount of light received. The recorded signal may then be recovered from these electrical signals.

An optical pickup is provided in the compact disc player for generating the laser beam, focusing it onto the disc surface, and directing the modulated reflected beam to the photosensor device. Conventionally, the laser beam is split into three parallel beams, a main beam and two auxiliary beams, which are focused through an object lens onto the disc surface. The main beam is focused directly onto the record track and is used for reading the recorded signal and for focal servo control. The auxiliary beams are focused along the record track ahead of and behind the main beam and are used for tracking servo control. The reflected beams pass back through the object lens and are then directed to the photodetector or photosensor device for processing and reproducing of the information signal as represented in the modulated beams. The photosensor device within the optical pickup thus is used not only for light detection in the modulated main beam to reproduce the information signal, but is also used for light detection in the main and auxiliary beams for focal servo control and tracking servo control in a conventional three beam tracking system. Consequently, the photosensor has a plurality of photosensitive elements, each receiving different portions of the reflected beams.

The compact disc player is contained in a housing or casing generally in a shape of a rectangle. If the optical pickup is moved parallel to one side of the rectangle, this side must be at least as long as the diameter of the disc within plus one half the width of the object lens in order to accommodate the optical pickup at its outermost position with the object lens centered over the outermost record track.

With the growing popularity of compact disc players, the trend has been towards reducing the size of the casing as much as possible. An advantageous compact disc player is disclosed in the commonly assigned U.S. patent application Ser. No. 06/603,370, referred to above, whose disclosure is herein incorporated by reference. The compact disc player disclosed therein includes an optical pickup whose structure and mounting allow the casing to be reduced to a minimum size. The optical pickup shown therein is moved radially with respect to the disc, as is conventional, but in a direction forming an acute angle with two opposed sides of the rectangular casing. The casing then takes the shape of a square with the disc inscribed therein.

When the optical pickup is thus driven in this acutely angled direction, the optical paths of the three beams must be altered. To understand this, it must be appreciated that in order to use the main beam and the two auxiliary beams as described, the three beams must be focused on the surface of the disc to lie along a straight line substantially tangential to the record track or at a small constant angle relative thereto. As will be described in detail below, this requires that the three beams be rotated by a predetermined angle about the optical axis of the main beam. Physically, the three beams are emitted parallel to each other and parallel to the surface of the disc, but lie in a plane which is tilted so as to intersect the surface at a predetermined angle. When the three beams are reflected from the surface of the disc and reformed parallel to the disc surface, they again lie in the tilted plane. Therefore, it is necessary that the photosensor device be mounted with the photosensitive elements in a plane at the same predetermined angle in order to properly detect the reflected beams.

Advantageously, the photosensor device is an integrated circuit and the photosensitive elements are semiconductor portions therein. The photosensor integrated circuit or chip is fixed in a relatively large, transparent package mounted in turn on a circuit board. Each photosensitive element has a pair of terminal leads extending therefrom with external portions extending outside of the package for connection to the focal and tracking servo control circuits also mounted on the circuit board. Since the photosensor device must be mounted at the above-mentioned predetermined angle relative to the surface of the disc, it is necessary to make a corresponding change in the wiring pattern of the circuit board. However, this significantly increases the space requirement for the package bearing the photosensor chip, thus limiting the reduction in size of the compact disc player.

OBJECTS AND SUMMARY OF THE INVENTION

Therefore, it is an object of the present invention to provide a photosensor device and an optical pickup incorporating the photosensor device which avoid the above-described difficulties of the prior art.

It is another object of the present invention to provide such a photosensor device mounted in a package with terminal leads extending therefrom which requires no more space on a circuit board than conventional photosensor devices.

It is a further object of the present invention to provide an optical pickup incorporating such a photosensor device which may advantageously be employed in an optical compact disc player.

It is still a further object of the present invention to provide an optical pickup incorporating the photosensor device which enables the size of the casing of the compact disc player to be minimized.

In accordance with an aspect of the present invention, there is provided a photosensor device comprising a package carrying a plurality of pairs of terminal leads, each terminal lead having an external portion extending outside of the package, the external portions being parallel to each other within a first plane and perpendicular to a first direction within the first plane, photosensing means mounted on the package and having a surface substantially parallel to the first plane and on which a plurality of photosensitive elements are formed and aligned in a second direction, each pair of terminal leads being electrically connected to a respective photosensitive element, and the second direction forming an angle $\theta$ with respect to a projection of the first direction onto the surface, said angle $\theta$ being other than $n\pi/2$, where n equals zero or a positive integer.

In accordance with another aspect of the present invention, there is provided an optical pickup device for reproducing information signals recorded on a surface of a disc in a substantially circular track, comprising laser source means for emitting a laser beam, first optical means for producing three optical beams from the laser beam directed along respective incident optical paths substantially parallel to each other and to the surface of the disc and lying in a first plane which is not parallel and not perpendicular to the disc surface, mirror means for reflecting the three optical beams to be incident on the track along a substantially tangential direction thereof and perpendicular to the surface, the three optical beams being reflected from the surface as return optical beams which are further reflected by the mirror means, second optical means for deflecting each of the return optical beams by a predetermined angle to lie in a second plane, and photosensor means including a plurality of photosensitive elements aligned in a first direction within the second plane for receiving the return optical beams, the first direction defining a mounting angle $\theta$ with respect to the surface other than $n\pi/2$, where n equals zero or a positive integer.

The above, and other objects, features and advantages of the present invention, will be apparent in the following detailed descriptions of illustrative embodiments which are to be considered in connection with the accompanying drawings, wherein like numerals designate like parts throughout.

BRIEF DESCRIPTION OF THE DRAWINGS

FIG. 7 is an enlarged crosssectional view taken along line III—III of FIG. 6;

FIG. 8 is a plan view of a second embodiment of a photosensor device according to the present invention; and FIG. 9 is a diagrammatic plan view of a record track on the surface of the disc and beam spots formed thereon.

DETAILED DESCRIPTION OF THE PREFERRED EMBODIMENTS

Figure 1:
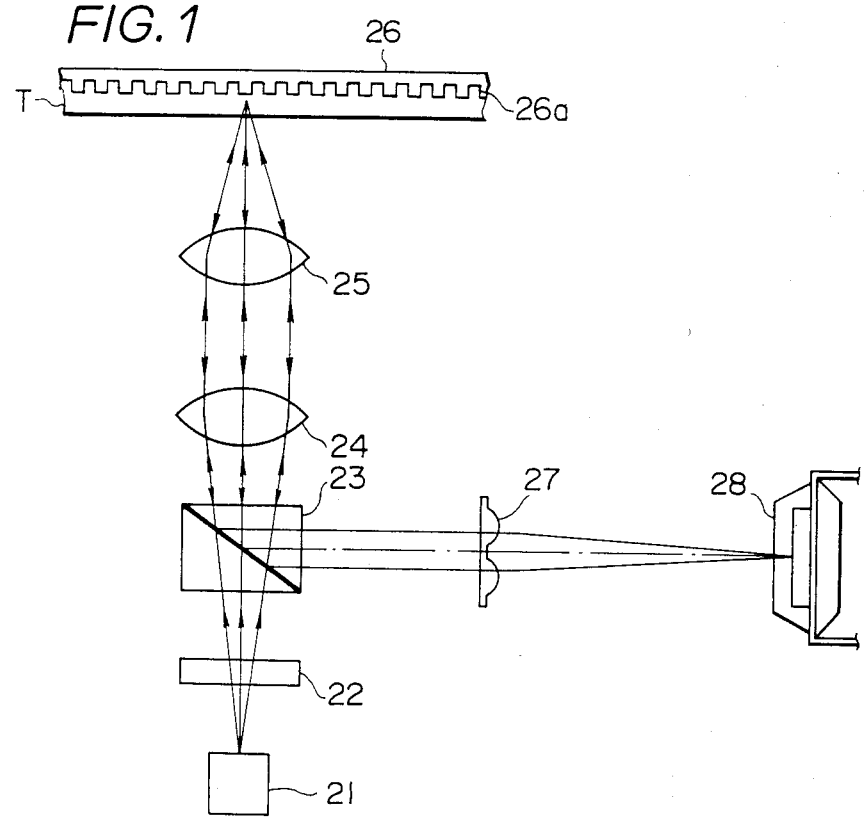
FIG. 1 is a schematic elevational view of the optical system of a conventional optical pickup for use in an optical compact disc player.

Referring now to the drawings and initially to FIG. 1 thereof, the overall optical system of a conventional optical pickup is shown to include a laser beam source 21, which may be, for example, a solid state laser or semiconductor laser, such as a laser diode. Laser beam source 21 emits a laser beam which is split by a diffraction grating 22 into three coherent light beams. These are a main beam, which is used for reproducing the information signal recorded on the optical disc and for focal servo control, and two auxiliary beams, one on either side of the main beam, used for tracking servo control. The three beams pass through a beam splitter 23, which acts as a half mirror to pass the incident beams, but to reflect the return beams, as illustrated. The beams are aligned into parallel by a collimation lens 24 and are focused by an object lens 25 onto a record surface of a disc 26. Disc 26 has an information signal recorded thereon in the form of pits or indentations, or bumps, schematically illustrated in FIG. 1 as a square wave 26a, and which are arranged along substantially circular tracks, as at T on FIG. 1. Each such track T may be a respective turn of a continuous spiral track arrangment on the disc. The main beam, as focused at a surface of disc 26, forms a main beam spot 45 (FIG. 9) intended to be centered on pits 44 of track T, while the two auxiliary beams form auxiliary beam spots 46, 47 lying ahead of and behind main beam spot 45, respectively, at opposite sides of the track T. When the beams are reflected back from the surface, they are modulated by pits 44 so as to be indicative of the recorded signal. As shown on FIG. 1, the modulated return beams pass back through object lens 25 and collimation lens 24 to beam splitter 23 and are reflected by the latter towards a double spot forming semicylindrical lens 27. Semicylindrical lens 27 splits each beam into two and directs the beams onto a photosensor device 28 so as to form a total of six separate beam spots. Photosensor device 8 includes photosensitive elements responsive to the light falling thereon in the six beam spots for producing electrical signals used for reproducing the information signals and for focal and tracking servo control, as is conventional.

Figure 2:
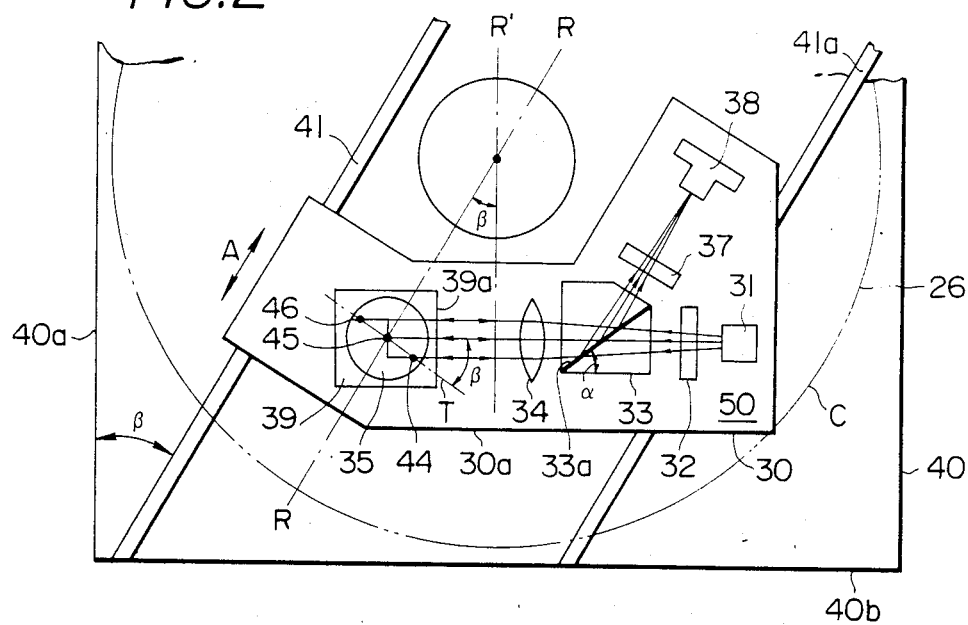
FIG. 2 is a diagrammatic plan view of the optical system of an optical pickup of a type in which the present invention as desirably embodied, and which is shown associated with a portion of an optical compact disc player.

An improved optical pickup 50 of the type disclosed in commonly assigned U.S. patent application Ser. No. 06/603,370, cited above, is diagrammatically illustrated in FIG. 2 and shown to include rectangular casing 40 which encloses and supports at least disc 26 and optical pickup 50 of the compact disc player. In order to reduce the vertical height of casing 40, the laser beam is emitted from a laser source 31 in a direction parallel to the surface of disc 26 and parallel to one side 40b of casing 40. By this means, most of the optical elements forming the optical system of optical pickup 50 may be arranged parallel to side 40b and to the surface of disc 26, rather than perpendicular to the surface, as in the optical system of FIG. 1, so that the height of optical pickup 50 and casing 40 enclosing it may be reduced. These elements are mounted on a base plate 30 parallel to the disc surface and include laser source 31, a diffraction grating 32, a beam splitter 33, a collimation lens 34, a double-spot forming semicylindrical lens 37 and a photosensor device 38, corresponding functionally to the similarly named elements illustrated in FIG. 1. The optical system of optical pickup 50 additionally includes a mirror 39 arranged following collimation lens 34 at a 45° angle to the disc surface. Mirror 39 serves to reflect the three beams by 90° to fall perpendicularly onto the disc surface. As may be more clearly seen in FIG. 3, base plate 30 and optical disc 26 are parallel to each other and to the three beams exiting from collimation lens 34. The three beams are reflected by mirror 39 and are focused by an object lens 35 onto the disc surface. As in the optical system of FIG. 1, the beams are reflected in a modulated condition indicative of the information signal recorded in track T on the disc surface, and pass back through object lens 35. They are again reflected by 90° from mirror 39 and pass back through collimation lens 34 to be deflected by beam splitter 33 (FIG. 2). In the illustrated embodiment, beam splitter 33 has a half mirror surface 33a which is inclined at an angle α less than 45° relative to the optical axis of the main beam. Therefore, the beams are deflected by an angle equal to 2α. The deflected beams pass through semicylindrical lens 37 and fall on photosensitive device 38 in two beam spots each. Thus, in optical pickup 50, only four elements, to wit, base plate 30, mirror 39, object lens 35 and disc 26, need be arranged vertically one above the other. This enables a significant reduction in the vertical height of casing 40.

A highly advantageous feature of the compact disc player incorporating optical pickup 50 illustrated in FIG. 2 is that optical pickup 50 is mounted to be driven in the direction indicated by arrows A at an acute angle β with respect to a side 40a of casing 40. To this end, optical base plate 30 of pickup 50 is mounted on parallel guide shafts 41, 41a which themselves are mounted at angle β with respect to side 40a. Object lens 35 is displaced from guide shafts 41, 41a so that it will be moved in a first radial direction R of disc 26 forming the same angle β with respect to a second radial direction R' parallel to side 40a. To read all the tracks T, optical pickup 50 is driven from an outermost position in which object lens 35 is centered over an outermost track to an innermost position in which lens 35 is centered over an innermost track. FIG. 2 illustrates pickup 50 in an intermediate position. However, it is easily seen that when optical pickup 50 is in its outermost position, a side 30a of base plate 30 will abut side 40b of casing 40, and will not extend substantially beyond the outer circumference C of disc 26. Therefore, side 40a of casing 40 does not have to be substantially longer than the diameter of disc 26 itself, while still enclosing the entire optical pickup 50.

Figure 4:
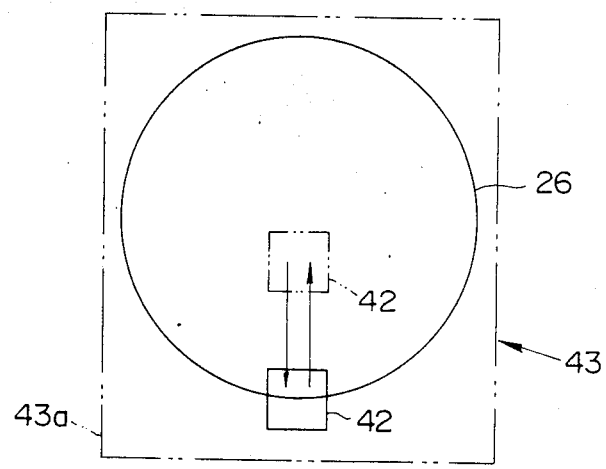
FIG. 4 is a diagrammatic plan view of another known type of optical compact disc player.

This represents a significant advantage, as may be seen from FIG. 4, which illustrates another type of compact disc player having an optical pickup 42 which moves parallel to a side 43a of a casing 43. In order for the center of an object lens within pickup 42 to overlie the outermost track, optical pickup 42 must extend by at least the radius of the object lens beyond the outermost track, as illustrated in solid lines in FIG. 4. Thus, side 43a must be longer by at least this distance to accommodate both disc 26 and the radius of object lens.

In the compact disc player of FIG. 2, the three beam spots 44, 45, 46 formed by focusing the three beams onto the surface of disc 26 should lie in a straight line tangential to track T or at a small constant angle relative thereto. FIG. 9 illustrates the correct positioning of main beam spot 45 and auxiliary beam spots 46, 47. Main beam spot 45 is focused directly onto the center of track T, while first auxiliary beam spot 46 lies ahead and a small distance to one side of track T and second auxiliary beam spot 47 lies behind and the same small distance to the other side of track T. As is well known in conventional three beam tracking servo control mechanisms, the reflected beams contain information from which it is possible to determine whether or not beam spots 45–47 are correctly aligned as in FIG. 9. However, in order to achieve the correct placement of beam spots 45–47 on track T when using optical pickup 50, the plane defined by the three beams must be rotated.

Figure 3:
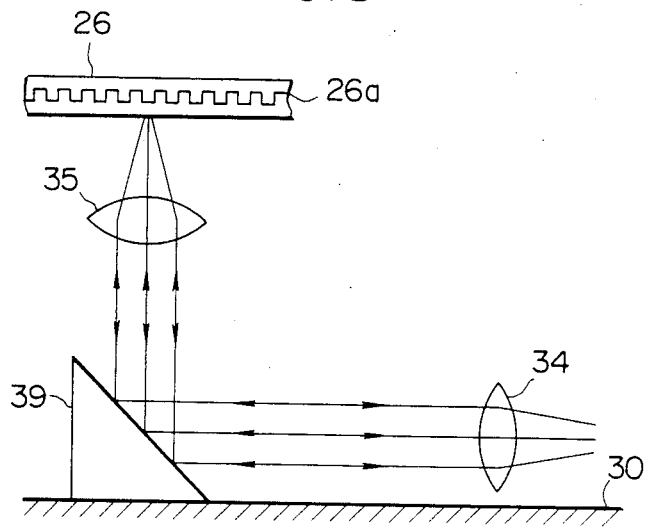
FIG. 3 is a front elevational view of a portion of the optical system of FIG. 2.

This may be seen from FIG. 2. Track T on disc 26 is illustrated in greatly magnified form, with main beam 45 spot and auxiliary beam spots 46, 47 lying in a straight line thereon. Of course, as shown in FIG. 9, the straight line extending through the centers of beam spots 45, 46 and 47 may not be exactly tangential to track T, but in any event beam spots 45–47 are all aligned along the same straight line, which for the purpose of this discussion may be taken as track T. As illustrated in FIG. 2, main beam spot 45 falls on radial direction R forming angle β with radial direction R' parallel to side 40a. Mirror 39 is of course not parallel to the surface of disc 26, but rather, as shown in FIG. 3, is at a 45° angle thereto, with side 39a parallel to the disc surface. If the three beams were to lie in a plane parallel to the disc surface, they would travel the same distance to reach mirror 39 and would be incident thereon along a line parallel to radial direction R', and consequently would be incident onto the disc surface in another straight line parallel thereto. This is not the case, but rather the three parallel beams lie in a plane tilted with respect to the disc surface, so that each travels a different distance before being incident on mirror 39, and consequently are reflected therefrom so as to fall along track T rather than along a line parallel with radius R'. Track T at the point where it is impinged by main beam spot 45, is perpendicular to radial direction R. Upon reflection from the disc surface and further reflection from mirror 39, the beams once again extend parallel to the record surface, and again lie in the same plane tilted relative to the record surface. Therefore, when the three beams pass back through collimation lens 34 and are deflected by beam splitter 33 to semicylindrical lens 37 to fall on photosensor device 38, they still lie in a plane tilted by the same angle with respect to the surface of disc 26. Accordingly, the photosensitive elements of photosensor device 38 must similarly be aligned within this tilted plane so as to receive the three beams in the correct orientation.

Figure 5:
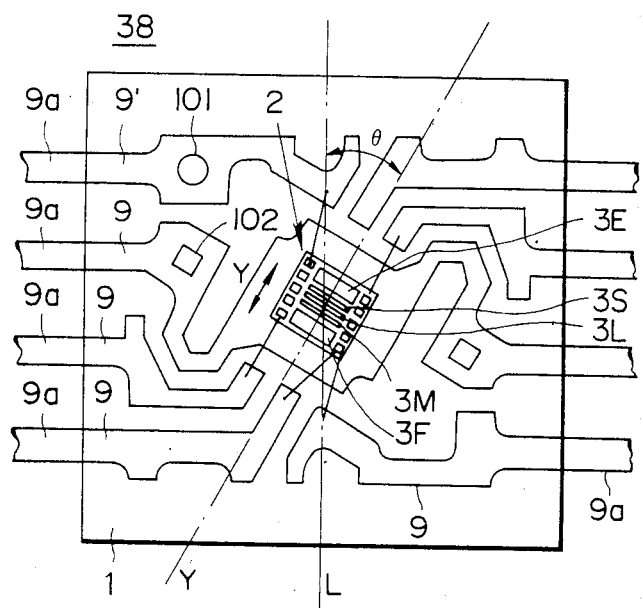
FIG. 5 is a plan view of a first embodiment of a photosensor device according to the present invention.
Figure 6:
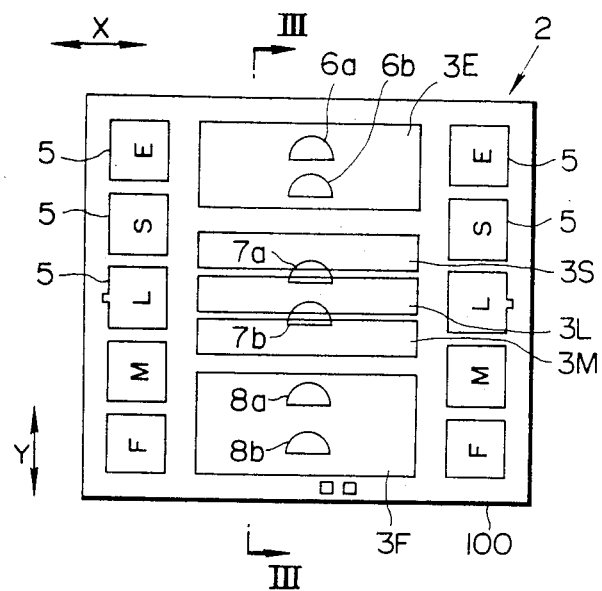
FIG. 6 is an enlarged plan view of a photosensor integrated circuit included in the photosensor device of FIG. 5.

This orientation may be seen in a first embodiment of the photosensor device 38 according to the present invention, illustrated in FIGS. 5–7. Referring first to FIG. 5, photosensor device 38 includes a photosensor integrated circuit or chip 2, advantageously formed as a semiconductor integrated circuit. Chip 2 is encapsulated in a molded package 1 made of transparent resin. A plurality of terminal leads 9 are carried by package 1 and are affixed to chip 2 within package 1. Terminal leads 9 have external portions 9a extending outside package 1.

As is more clearly seen in FIG. 6, chip 2 has five photosensitive elements 3E, 3S, 3L, 3M and 3F formed on a major planar surface thereof. Photosensitive elements 3E–3F are advantageously formed of appropriately doped semiconductor regions having rectangular configurations at the planar surface, with two long sides of each photosensitive element 3E-3F being parallel to a direction X in FIG. 6, and two short sides being parallel to a direction Y. As illustrated in FIG. 5, direction Y is not parallel or perpendicular to any side of package 1, but rather includes a chip mounting angle $\theta$ with respect to a direction L parallel to the sides of package 1 from which external portions 9a of the leads emerge. In addition, external lead portions 9a are all parallel to each other and perpendicular to the direction L. Moreover, chip mounting angle $\theta$ is selected so as not to be equal to $n\pi/2$, where n is zero or a positive integer.

Chip mounting angle $\theta$ is further selected so that the three beams will fall on photosensitive elements 3E-3F in the alignment illustrated in FIG. 6, that is, along a line centered between and parallel to the short sides of the rectangular elements 3E-3F. As noted above, semicylindrical lens 37 splits each beam into two beams, so that six resultant semi-circular beam spots will appear on chip 2, as at 6a,6b,7a,7b,8a,8b. In order for this proper alignment of beam spots relative to photosensitive elements 3E-3F to exist, chip mounting angle $\theta$ defined between the alignment direction Y of photosensitive portions 3E-3F and straight line L is selected as a function of the angle $\beta$ between the optical path of the main beam in between mirror 39 and collimation lens 34, as shown in FIG. 2, and the direction of track T directly opposite object lens 35. More particularly, chip mounting angle $\theta$ should be selected such that $$\theta = n\pi/2 + \beta$$

where n is 0 or a positive integer, and tilt angle $\beta$ is restricted such that $$0° < \beta < 90°$$

For example, if tilt angle $\beta$ is equal to 30°, chip mounting angle $\theta$ of photosensor device may be 30°, 120°, 210°, or 300°. Chip mounting angle $\theta$ is not dependent on deflecting angle $\alpha$ of beam splitter 33. Advantageously, chip mounting angle $\theta$ is between 15° and 75°.

When chip 2 is mounted with photosensitive elements 3E-3F at chip mounting angle $\theta$, the six beam spots 6a-8b impinge on photosensitive elements 3E-3F along a line in the correct direction. Thus, chip mounting angle $\theta$ is also the angle between the disc surface and the tilted plane containing the return optical beams after deflection from beam splitter 33. It is not necessary to further rotate the beams following their reflection from the surface of disc 26.

The structure of chip 2 will now be described in greater detail in connection with FIGS. 6 and 7. As shown in FIG. 6, photosensitive elements 3E, 3S, 3L, 3M and 3S are formed as respective central rectangular photodiode portions. First and second anode portions 5 are mounted at opposite sides of the photosensitive elements on a base or substrate 100. As is more clearly seen in the crosssectional view of FIG. 7, base 100 is formed of N− type semiconductor material. Photosensitive elements 3E-3F are P+ type semiconductor regions with isolation regions of N+ material electrically isolating them. Another region or layer 100a of N++ type material is formed on the reverse side of base 100, with a back electrode 4 serving as a common cathode for the five photosensitive elements 3E-3F. The respective anode portions 5 are conventionally constructed as pads of aluminum or similar material for receiving terminal leads 9. As is further shown in FIG. 6, the six beam spots 6a, 6b, 7a, 7b, 8a, 8b fall on the five 3E-3F photodiodes in a straight line along the Y direction, to produce a pattern thereon which may be used conventionally for focus and tracking servo control. The specific circuits by which the received pattern of beam spots is used for focal and tracking servo control does not form part of the present invention, and will not be described herein.

As illustrated in FIG. 5, chip 2 is mounted within package 1 with the Y direction at the angle $\theta$ relative to the L direction so that photosensitive portions 3E-3F aligned in the Y direction will properly receive the three optical beams. However, the external portions 9a of terminal leads 9 extending outside of package 1 are arranged in a common plane within which they are perpendicular to direction L and parallel to each other. Relative to the sides of package 1, then, external portions 9a have the same configuration as in a conventional photosensor package. Thus, package 1 containing chip 2 may be mounted on a circuit board bearing the focal and tracking servo control circuits and requires no more space therefor than do conventional photosensor packages. By virtue of the alignment of chip 2 within package 1 so that photosensitive elements 3E-3F are already aligned in the Y direction, the size of the circuit board, and consequently the size of the compact disc player itself, may be maintained at the minimum.

In the embodiment illustrated in FIG. 5, photosensitive elements 3E-3F and the respective anode portions 5 are formed on chip 2 with sides parallel or perpendicular to the sides of chip 2 itself. However, this is not necessary, and a second embodiment of photosensor device 38' according to the present invention is illustrated in FIG. 8. As shown therein, five photodiodes 13E, 13S, 13L, 13M and 13F are again aligned in the Y direction but now the sides of photodiodes 13E-13F are no longer parallel to the sides of chip 12, but rather lie at the chip mounting angle $\theta$ relative thereto. Anode portions 15 are distributed on chip 12 in the available space so as to be accessible to terminal leads 9. In this second embodiment, the sides of chip 12 are parallel to the sides of package 11, so that chip 12 may be sealed in a package using a standard molding die.

Another advantageous feature of each photosensor device 38, 38' according to the present invention is that the first terminal lead 9' connected to one anode portion 5, 15 of first photosensitive element 3E, 13E may be indicated by a cutout portion 101 therein having a different shape from a cutout portion 102 of the remaining terminal leads 9. As illustrated in FIGS. 5 and 8, first cutout portion 101 may be in the form of a circle, while second cutout portions 102 may be in the shape of a square.

Therefore, in accordance with the present invention, the alignment direction of the photosensitive elements within the photosensor device is rotated by a predetermined chip mounting angle $\beta$ with respect to the package bearing the photosensor device. More precisely, this alignment direction is rotated by chip mounting angle $\theta$ with respect to straight line L and such chip mounting angle $\theta$ is function of tilt angle $\beta$. Thus, when the photosensor device according to the present invention is used in an optical pickup where return optical beams lie in a plane rotated by the chip mounting angle $\theta$ about the optical axis of the main beam, and are irradiated onto the photosensor device, the photosensitive elements thereof are already aligned in the correct direction, so that there is no need for the package bearing the photosensor device itself to be rotated for mounting. The result is that the space required for mounting the package on the circuit board is reduced to a minimum, and the wiring is simplified. In the second above-described embodiment of the photosensor device according to the present invention, the sides of chip 12 are parallel to the sides of package 11, so that standard mold dies for package molding may be used.

It is of course possible to make package 1 smaller than the standard size, with photosensitive elements 3E-3F mounted therein in the conventional position, i.e. without rotation and perpendicular to the direction of the terminal leads. Then the smaller package itself could be rotated for mounting and still be within the outer contour of package 1 shown in FIG. 5. However, with such smaller package, of course, only short portions of the terminal leads will be encapsulated by the package. Moreover, the resin used in transparent packages is relatively weak and lacks good moisture resistance, since reinforcing and moisture resistant fillers are generally not transparent and cannot be used. Thus the smaller package is prone to deterioration from moisture and may rupture, and the terminal leads are more easily pulled from the package. For acceptable operating reliability, the package should be substantially the conventional size. Therefore, it is highly advantageous that the photosensitive elements be mounted in the package at chip mounting angle $\theta$.

Of course, package 1 need not be entirely transparent, but can be transparent only in that portion encapsulating photosensitive elements 3E-3F. Also, different types of optical pickups, other than the one specifically described herein, may incorporate the photosensor device according to the present invention, and the photosensor device may also be used in optical systems other than the optical compact disc player described herein.

Having described specific embodiments of the invention with reference to the accompanying drawings, it will be understood that the invention is not limited to such specific embodiments, and that many modifications and variations may be effected therein by one skilled in the art without departing from the spirit or scope of the invention which is to be defined by the appended claims.

What is claimed is:

1. A photosensor device comprising:
  a package carrying a plurality of pairs of terminal leads, each terminal lead having an external portion extending outside of said package, said external portions being parallel to each other within a first plane and perpendicular to a first direction within said first plane;
  photosensing means mounted on said package and having a surface substantially parallel to said first plane;
  a plurality of photosensitive elements formed on said surface and aligned thereon in a second direction;
  each pair of terminal leads being electrically connected to a respective photosensitive element;
  said second direction forming an angle $\theta$ with respect to a projection of said first direction onto said surface, said angle $\theta$ being other than $n\pi/2$, where n equals zero or a positive integer.

2. A photosensor device according to claim 1, wherein said photosensing means has a rectangular crosssection in said surface and said second direction is parallel to a side of said rectangular cross-section.

3. A photosensor device according to claim 1, wherein said photosensing means has a rectangular crosssection in said surface, said second direction and a side of the rectangular cross-section includes said angle $\theta$ and said first direction is parallel to said side.

4. A photosensor device according to claim 1, wherein said angle $\theta$ is greater than 15° and is less than 75°.

5. The photosensor device according to claim 1, wherein there are five of said photosensitive elements.

6. The photosensor device according to claim 1, wherein said photosensing means is encapsulated within said package.

7. The photosensor device according to claim 6, wherein at least a portion of said package surrounding said photosensing means is formed of a transparent material.

8. The photosensor device according to claim 6, wherein said package is formed of a transparent material.

9. The photosensor device according to claim 1, wherein said photosensing means is a photosensing integrated circuit, said photosensitive elements are semiconductor photodiode elements formed in said integrated circuit, and said integrated circuit further includes non-photosensitive regions electrically isolating said photosensitive elements from each other.

10. The photosensor device according to claim 9, wherein there are five of said photosensitive elements.

11. The photosensor device according to claim 1, wherein each of said photosensitive elements includes a photosensitive portion and an electrical contact portion, and each of said terminal leads is electrically connected to the respective photosensitive element at said electrical contact portion of the latter.

12. The photosensor device according to claim 11, wherein each said electrical contact portion includes two electrical contacts respectively connected to first and second ones of the respective pair of terminal leads.

13. An optical pickup device for reproducing information signals recorded on a surface of a disc in a substantially circular track, comprising:
  laser source means for emitting a laser beam;
  first optical means for producing three optical beams from said laser beam along respective incident optical paths substantially parallel to each other and to said surface of said disc and lying in a first plane which is at an acute angle to said surface;
  mirror means for reflecting said three optical beams to be incident on said track at locations spaced along a substantially tangential direction thereof and perpendicular to said surface, said three optical beams being reflected from said surface as return optical beams, said mirror means further reflecting said return optical beams;
  second optical means for deflecting each of said return optical beams by a predetermined angle to lie in a second plane; and
  photosensor means including a plurality of photosensitive elements aligned in a first direction within said second plane for receiving said return optical beams, said first direction defining, with respect to said surface, a mounting angle $\theta$ which is other than $n\pi/2$, where n equals zero or a positive integer.

14. An optical pickup device according to claim 13, wherein said first optical means includes diffraction grating means for splitting said laser beam into said three optical beams; and collimating lens means for orienting said three optical beams to be parallel to each other.

15. An optical pickup device according to claim 13, further comprising a base plate; said laser source means, said first optical means, said mirror means, said second optical means, and said photosensor means being mounted on said base plate.

16. An optical pickup device according to claim 13, wherein said three optical beams are incident on said surface at locations spaced along a direction tangential to said track.

17. An optical pickup device according to claim 13, wherein said second optical means includes half-mirror means by which the return optical beams are directed to said photosensor means.

18. An optical pickup device according to claim 13, wherein said photosensor means include a plurality of terminal leads electrically connected to said photosensitive elements, said terminal leads having respective external portions extending parallel to each other and perpendicular to a straight line, said first direction of said photosensitive elements forming said mounting angle $\theta$ with respect to said straight line.

19. An optical pickup device according to claim 18, further comprising means mounting said optical pickup device for movement radially with respect to said disc such that said beams perpendicularly incident on said surface are moved in a radial direction of said disc.

20. An optical pickup device according to claim 19, further comprising a rectangular casing enclosing at least said disc and said optical pickup device, said radial direction of said disc being at an acute tilt angle $\beta$ with respect to a second radial direction of said disc perpendicular to a side of said rectangular casing.

21. An optical pickup according to claim 20, wherein said mounting angle $\theta$ is a function of said tilt angle $\beta$ such that $\theta = n\pi/2 + \beta$, where n equals zero or a positive integer.

* * * * *